(12) United States Patent
Barnardo et al.

(10) Patent No.: US 7,088,039 B2
(45) Date of Patent: Aug. 8, 2006

(54) ELECTROLUMINESCENT DISPLAYS

(75) Inventors: Christopher Barnardo, Bishops Stortford (GB); Richard Blakeney, Saxon Way (GB); Christopher James Newton Fryer, Cottenham (GB); Frank Tyldesley, Saxon Way (GB)

(73) Assignee: Pelikon Limited, Caerphilly (GB)

( * ) Notice: Subject to any disclaimer, the term of this patent is extended or adjusted under 35 U.S.C. 154(b) by 179 days.

(21) Appl. No.: 10/708,607

(22) Filed: Mar. 15, 2004

(65) Prior Publication Data

US 2005/0029532 A1   Feb. 10, 2005

(30) Foreign Application Priority Data

Aug. 7, 2003   (GB)   ................. 0318598.0

(51) Int. Cl.
*H01J 1/62*   (2006.01)

(52) U.S. Cl. .................... 313/510; 313/506

(58) Field of Classification Search ............ 313/498, 313/506, 509, 510, 512
See application file for complete search history.

(56) References Cited

U.S. PATENT DOCUMENTS

| | | | |
|---|---|---|---|
| 3,514,825 A | 6/1970 | Vodicka | |
| 3,631,285 A | 12/1971 | Laisi et al. | |
| 3,650,824 A | 3/1972 | Szepsei et al. | |
| 5,634,835 A | 6/1997 | Wu et al. | |
| 5,720,639 A | 2/1998 | Stevenson | |
| 5,747,128 A | 5/1998 | Topp | |
| 5,902,688 A | 5/1999 | Antoniadis et al. | |
| 6,069,444 A | 5/2000 | Krafcik et al. | |
| 6,751,898 B1 | 6/2004 | Heropoulos et al. | |
| 2001/0018809 A1 | 9/2001 | Heropoulos et al. | |

FOREIGN PATENT DOCUMENTS

| | | |
|---|---|---|
| EP | 0286748 A1 | 10/1988 |
| EP | 0 998 171 A | 5/2000 |
| GB | 1010134 A | 11/1962 |
| GB | 1467738 A | 7/1974 |
| WO | WO 99/55121 A | 10/1999 |

*Primary Examiner*—Vip Patel
(74) *Attorney, Agent, or Firm*—Sutherland Asbill & Brennan LLP (57) ABSTRACT

Certain materials are electroluminescent, and this electroluminescent effect has been used in the construction of backlights for displays. Such a backlight commonly consists of a transparent front layer (11) known as the substrate carrying over its rear face a transparent electrically-conductive film (12) forming the backlight's front electrode and covered by a layer of electroluminescent/phosphor material (13) over the rear face of which is a high-dielectric dielectric layer (16) bearing on its rear face a conductive film (17) forming the back electrode. The whole is positioned behind a mask (18) that defines whatever characters the display is to show. This use of a mask has some disadvantages, some of which can be overcome by utilizing an array of suitably shaped individual electrodes (21) instead of a continuous one; however, this itself has drawbacks, since the lead (22) to each electrode acts as an electrode in its own right, activating the phosphor to show faint but distracting additional illumination.

10 Claims, 5 Drawing Sheets

ELECTROLUMINESCENT DISPLAYS

DETAILED DESCRIPTION

1. Technical Field

This invention is concerned with electroluminescent displays, and relates in particular to improving the uniformity and visibility of such displays.

2. Background of the Invention

Certain materials are electroluminescent—that is, they emit light, and so glow, when an electric field is generated across them. The first known electroluminescent materials were inorganic particulate substances such as zinc sulphide, while more recently-found electroluminescent materials include a number of plastics—synthetic organic polymeric substances—known as light-emitting polymers (LEPs). Inorganic particulates, in a doped and encapsulated form, are still in use, particularly when mixed into a binder and applied to a substrate surface as a relatively thick layer; LEPs can be used both as particulate materials in a binder matrix or, which some advantages, on their own as a relatively thin continuous film.

This electroluminescent effect has been used in the construction of displays, in which a large area of an electroluminescent material—generally referred to in this context as a phosphor—is provided to form a backlight which can be seen through a mask that defines whatever characters the display is to show.

Such a backlight commonly consists of, from front (the side from which it is to be viewed) to back: a relatively thick protective electrically-insulating transparent front layer known as the substrate and made usually of a glass or a plastic such as polyethylene terephthalate (PET); over the entire rear face of the substrate, a very thin transparent electrically-conductive film made from a material such as indium tin oxide (ITO), this forming one electrode—the front electrode—of the backlight; covering the rear face of the front electrode, a relatively thin layer of electroluminescent/phosphor material (usually a particulate phosphor within a binder matrix); over the rear face of the phosphor layer, a relatively thin electrically-insulating layer of a material—usually a ceramic—having a relatively high dielectric constant (relative permittivity) of around 50; covering the entire rear face of the phosphor layer, a continuous electrically-conductive film, usually opaque (and typically carbon or silver), forming the other electrode—the back electrode—of the backlight.

In addition, the back electrode layer, which is quite delicate, is covered with a protective film (usually another, similar, ceramic layer) to prevent the layer being damaged by contact with whatever device components—electronic circuitry, for example—might be mounted behind the display.

Each of the various layers is conveniently screen-printed into place (apart from the ITO front electrode, which is usually sputtered onto the substrate) in the normal way, through masks that define the shape, size and position of the layer components, using suitable pastes that are subsequently dried, set or cured, commonly by heat or ultra-violet light, as appropriate, prior to the next layer being applied. And in the context of electroluminescent displays, the expressions "relatively thick" and "relatively thin" mean thicknesses in the ranges, respectively, of 30 to 300 micrometers, usually around 100 micrometers, and less that 50 micrometers, and most usually 25 micrometers or less.

In a display, such a backlight is positioned behind a mask that defines whatever characters the display is to show. Unfortunately, to form a truly effective, easy-to-read display the background uniformity of the display must be well controlled so as not to distract the eye of the Viewer from the information that it is intended to reveal. To date this has not satisfactorily been achieved for electroluminescent displays.

As intimated above, the majority of electroluminescent displays exploit the uniform illumination properties of the electroluminescent principle as a backlight, enabling graphics characters to be formed through the use of cut out overlays that allow the light to shine through specific apertures. Characters formed in this way using particulate phosphors tend to be less than sharp. Moreover, such a display is an "all or nothing" display; when the backlight is "on", all the characters are illuminated, while when it is "off" none of them are.

It was then realised, however, that much clearer, crisper displays, with individually-activatable characters, could be constructed by "reversing" the normal structure of backlight with masking overlays. More specifically, it was found that if the phosphor layer were associated on at least one side (and particularly at the rear) with an array of individual appropriately-shaped electrodes instead of a continuous electrode then the mask could be done away with completely, for the phosphor could be inherently activatable in the forms of the discrete shapes desired—for example, an ikon, an alphanumeric character, or a pattern of independently-switchable segments that by their arrangement provide reconfigurable information—so there could be made a display that had the desired sharpness.

The thus-formed displays were indeed a considerable advantage over the previous, mask-utilising, ones, but they still suffered from a number of drawbacks. One such arose directly from the use of individual appropriately-shaped shaped back electrodes instead of a continuous electrode; whereas with a continuous back electrode extending effectively from edge to edge of the display an activating voltage could be supplied by a lead to a contact at the very edge of the display, which could easily be hidden from sight, individual back electrodes required leads, formed as conductive tracks laid onto the dielectric layer carrying the electrodes, some of which track leads necessarily crossed over the main area of the display. And since each track lead, even though extremely narrow, acted as an electrode in its own right, the phosphor was activated not only by each individual shaped electrode but also by the lead to that electrode, giving rise to a faint, but distracting (and possibly confusing), additional source of illumination, making each ikon or character of the display look as though it had a tail.

Various attempts have been made to deal with this problem, and one of the more successful to date is not to form the lead tracks directly on the dielectric layer carrying the back electrodes, as is usual, but instead to space the tracks further from the electroluminescent material layer by placing an additional insulating layer, between the tracks and the dielectric layer carrying the electrodes, so as to reduce the field produced by the tracks, and so minimize the unwanted activation and illumination effect of the underlying phosphor. However, each track lead still acts as an electrode, and so still gives rise to a faint, albeit now much fainter, source of illumination, so that each ikon or character of the display still looks as though it has a tail.

SUMMARY OF THE INVENTION

This problem of track-derived tails is one of the problems that the present invention seeks to deal with—and here it proposes to do so by in either of two ways. In one, it suggests forming the electroluminescent material itself into discrete areas each tightly matching in shape and size the relevant individual shaped back electrode, while in the other it suggests placing between an electroluminescent material layer (even a continuous such layer) and the shaped back electrodes a shield—a conductive layer—that matches in shape and size a negative of the several shaped areas of the electrodes and so will in use block the field generated across the front and back electrodes everywhere except in the areas matching the shaped electrode areas. With hindsight these simple changes and especially that of shaping the electroluminescent material to match the shaped electrode areas—may seem somewhat obvious, but it must be pointed out that, in the many years since electroluminescent displays have been in use, no-one has suggested doing either.

In a first aspect, therefore, the invention provides an electroluminescent display of the type wherein a layer of electroluminescent material is sandwiched between but spaced from two electrode layers, which display has a plurality of separately-activatable individual areas each of electroluminescent (phosphor) material, in which display: both the back electrode layer and also the electroluminescent material layer are each composed of a plurality of separate areas each matching in shape and size the image which the relevant portion of the display is to show.

In a second aspect, moreover, the invention provides an electroluminescent display of the type wherein a layer of electroluminescent material is sandwiched between but spaced from two electrode layers, which display has a plurality of separately-activatable individual areas each of electroluminescent (phosphor) material, in which display: the back electrode layer is composed of a plurality of separate areas each matching in shape and size the image which the relevant portion of the display is to show; a shield layer of electrically-conductive material shaped and sized as a negative of the shaped area back electrode is positioned as an intermediate electrode between and aligned with the shaped area electrode and the electroluminescent material layer; and means are provided enabling the shield layer intermediate electrode to be given the same electrical potential as the front electrode.

In the display of the invention the images to be displayed are in use crisply defined by the combination of shaped back electrode and either shaped phosphor or negatively-shaped shield layer intermediate electrode. Unlike those displays known hitherto, therefore, that of the invention does not need an image-defining mask.

The invention provides an electroluminescent display for some sort of device. This device can be of any shape and form, and for any purpose. A typical example of such a device is a hand-holdable controller—a remote control—for a radio, an audio cassette tape deck, a CD player, a television, a DVD player or a video recorder, and for such a use the device will normally have an oblong panel, perhaps 13×5 cm (5×2 in), on which are positioned a plurality of individual display elements appropriate to the device's purpose. Thus, for instance, for a tape deck the display elements might be ikons (or words, or the individual letters of words) that represent (amongst other possibilities) "play", "fast forward", "fast reverse", "record", and "stop".

The display of the invention is an electroluminescent display—that is, it is a display which uses electroluminescence to light up its several parts. More specifically, it is such a display utilising layers of a particulate electroluminescent material—a particulate phosphor—rather than continuous sheets or films of electroluminescent material. The particulate phosphor can be a light-emitting plastic (LEP) in particulate form, but most preferably it is an inorganic material; a typical inorganic particulate phosphor is zinc sulphide, especially in the form of encapsulated particles (encapsulation provides substantially-increased stability and life). An especially convenient such zinc sulphide is that heat-curable material available under the name 7151j Green Blue from Dupont, in a layer around 25 micrometer thick. Another such sulphide is 8164 High Bright Green, also from DuPont.

Unlike many electroluminescent displays known in the art, the invention's display has, instead of a single large area of uniformly-activatable electroluminescent material forming a "back light" to the mask-defined characters or ikons to be displayed, separately-activatable individual areas each of which represents either a whole or a part of a character or ikon to be displayed. As a result, the display appears much sharper, crisper and "cleaner" than the conventional back-panel versions.

In this display each character or ikon can be whole and complete in itself—an individual number or letter (of the alphabet), or an ikon (or symbol, pictogram, cartouche or glyph) representing some desired effect (such as the right-pointing single chevron commonly employed to mean "play", or the similar double chevron meaning "fast forward"). However, in addition—or as an alternative—the individual areas can form small parts of a larger region which itself has some meaning or message. Thus, the small individual areas can be grouped into sets of related character-defining segments each group of which can, by the activation of the appropriate segments, define any character there to be displayed. A typical group is the standard seven-segment group commonly employed in modern electrical and electronic displays; by suitably choosing which of the segments is switched on, so the group can be made to display any Arabic numeral or Roman-alphabet character (other numbering or alphabet systems may need groups with more segments). The groups themselves can of course be disposed in an array; by manipulating each of the portions of the array so there may be presented, for example, a complete textual message.

Each activatable area comprises a thin (around 25 micrometer) layer of phosphor having on either side—adjacent each face of the layer—the (front or rear) electrode which is used to provide the voltage across the layer to switch it into its electroluminescent state. More specifically, in the first aspect of the invention—that aspect using shaped phosphor areas—that back electrode and also the electroluminescent material are each composed of a plurality of separate areas each matching in shape and size the image which the relevant portion of the display is to show. The thus-shaped back electrode is accordingly patterned, to form an array of separate appropriate tightly-defined outline shapes at the resolution of the information or information segments to be displayed, and each shape of this array is addressable (supplied with the driving voltage) independently of all the others.

In addition, in this first aspect the electroluminescent layer—the phosphor—is itself patterned with an appropriate array of tightly-defined outline shapes at the resolution of the information or information segments to be displayed.

As in the art, the phosphor layer is covered with an insulating layer, usually of ceramic material. A typical such material is DuPont's heat-curable 7153e, or their UV-curable 5018 ceramic, in a layer around 10 to 15 micrometer thick. The back electrodes are then formed on this insulating layer, usually utilising a silver paste such as Norcote's UV-curable ELG110 to lay down a relatively thin layer—around 20 micrometer—where required.

The rear face of the display may then be protected with a thin—15 micrometer—ceramic insulating layer (typically using DuPont's 5018, as above, though another possibility is Coates' UV600G).

By the shaped electrode/phosphor arrangement of the invention—both the back electrode and also the phosphor itself being composed of a plurality of separate areas each matching the image to be shown—so there is formed a display wherein, at least in principle, there can, in use be seen only the desired images, without any sign of "tails" caused by the electrodes' lead tracks. However, in practice it may be that the two arrays of shapes—in the chosen electrode and in the phosphor—are not be perfectly aligned, with the result that some very short portion of an electrode's lead track may in fact overlap, and so activate, the corresponding phosphor shape.

This out-of-registration problem can satisfactorily be dealt with in a number of ways. One—as already proposed—is to space the lead tracks further from the phosphor than their electrodes, so that the tracks necessarily have a less "activating" effect. If the spacing is sufficient then the activation of the phosphor by the tracks will be insignificant compared to that of the electrodes, and so will not be a distraction. Thus, if the chosen electrode array is the back electrodes, they are first formed without tracks, the spaces in between are then coated with an additional layer of an insulating material (typically a ceramic such as that already used between the back electrodes and the phosphor), and then the tracks are formed (with the same sort of silver paste) over the top of the insulating layer, so that the tracks are spaced further from the phosphor than the back electrodes, and thus their effect is suppressed.

An alternative solution, when using patterned back electrodes, is to shield the phosphor from the effect of the voltage in the tracks themselves by placing a suitably-patterned (track-like) third electrode between the phosphor and the lead tracks, and then applying to that third electrode the same voltage as applied to the front electrode. This third, or intermediate, track-like electrode—which is conveniently positioned adjacent but insulated from the back electrode tracks, and between them and the conventional insulating layer covering the phosphor layer, and made of the same sort of cured silver paste—is patterned to match the pattern of tracks to the various back electrode parts, and the result is that in use any voltage field the tracks generate is blocked, thus suppressing activation of any phosphor layer thereunder.

In the second aspect of the invention each activatable area comprises, as before, a layer of phosphor having on either side—adjacent each face of the layer—the (front or rear) electrode which is used to provide the voltage across the layer to switch it into its electroluminescent state. And as before the back electrode is patterned—composed of a plurality of separate areas each matching in shape and size the image which the relevant portion of the display is to show. In addition, however, in this second aspect a negatively-patterned shield layer is positioned as an intermediate electrode between and aligned with the shaped area electrode and the electroluminescent material layer, and there are means enabling this shield layer intermediate electrode to be maintained at the same electrical potential as the front electrode.

There is not much that need be said about this intermediate electrode layer—which acts as a mask for the shaped-area back electrode—save that it can be formed of any suitable electrically-conductive material (typically silver), and that it can be applied by screen printing an appropriate silver-loaded paste—typically that mentioned above—onto the phosphor in the normal way. Of course, the correspondingly, but "positive", back electrode must then be applied in register with the intermediate layer, but that needs no comment here.

The means enabling this shield layer intermediate electrode to be maintained at the same electrical potential as the front electrode is usually little more than a simple electrical connection between the two, either internally of or external to the display.

It should be noted that in accordance with the second aspect of the invention—using an aligned intermediate-electrode electrically-conductive shield layer formed as a negative of the back electrode shaped area pattern—the electroluminescent material (phosphor) layer can be continuous, for the required shaping of the image is effected by the combination of the patterned back electrode and the negatively-patterned shield. However, it is still possible also to shape the phosphor layer itself into a plurality of image-defining areas, if that be thought beneficial.

In the invention either both the back electrode layer and the electroluminescent layer—the phosphor—itself are patterned with matching appropriate arrays of tightly-defined outline shapes at the resolution of the information or information segments to be displayed, or the back electrode is so patterned and in addition there is utilised an aligned intermediate-electrode electrically-conductive shield layer formed as a negative of the same pattern and in use having the electrical potential of the front electrode.

By this arrangement—both the back electrode and also the phosphor itself being composed of a plurality of separate areas each matching the image to be shown—so there is formed a display wherein, at least in principle, there can, in use be seen only the desired images, without any sign of "tails" caused by the electrodes' lead tracks.

The various layers of material from which the display of the invention is constructed can be formed by the usual screen printing methods, utilising the various techniques and paste-like materials generally known for that purpose, and no more need be said about that here.

Finally, in addition, the substrate may be overlaid with an exterior protective film, which can if appropriate be coloured or bear legends of one sort or another.

As described in connection with the invention's first aspect, generating the display using a shaped-area back electrode and a correspondingly shaped-area phosphor layer provides a sharp, crisp display, and does away with the requirement for an image-defining mask. However, the thus-formed display may still suffer from a number of drawbacks, one of which derives from the very "removal" of the mask and the concomitant shaping of the electroluminescent material. The problem is that even when the electroluminescent material—the phosphor—is not activated, and so is not emitting light, it can itself be seen, albeit only dimly, by reflected light—by light passing into the display from the ambient surroundings and then being reflected back out off the various display components. This is aggravated by the fact that the material "surrounding" the display's phosphor shapes, namely the insulating layer (usually a ceramic) is of a different colour, and a different reflectivity, to that of the phosphor layer, so emphasising the visibility of the phosphor shapes even when unactivated.

The invention suggests a simple solution to this, which is to modify—or apparently to modify—the colour/reflectivity of one or other of the phosphor and the surrounding insulator material so as to match that of the other, and thus cause the phosphor and insulator material to blend with, and so be less distinguishable from, each other.

In a third aspect, therefore, this invention provides an electroluminescent display of the type wherein a layer of electroluminescent material is sandwiched between but spaced from two electrode layers, and the electroluminescent material is composed of a plurality of separate areas each matching in shape and size the image which the relevant portion of the display is to show, each such area being surrounded by a layer of insulating material, in which display the colour/reflectivity of one or other of the electroluminescent material and the surrounding insulator material is modified—or is apparently modified—so as to match that of the other.

The electroluminescent display, the materials of which and the manner in which it is formed, and the device of which it is a part, may be as described hereinbefore, and no more need be said about that here.

In this improved display display the colour/reflectivity of one or other of the electroluminescent material—the phosphor—and the surrounding dielectric material (the ceramic/insulator) is modified so as to match that of the other. This can be achieved in a number of distinct ways.

Firstly, the colour/reflectivity of the insulator material can be changed to match that of the phosphor. Thus, the insulator material to be used can be blended with suitable colouring materials—inks—to give a colour match to the "off" (unactivated) state of the phosphor, so that when the coloured insulator material is then deposited everywhere the phosphor is not—that is, around the phosphor—there is presented the impression of a continuous layer when the combination is viewed through the transparent electrode.

The commonly-employed phosphors—for instance, the particular zinc sulphide referred to above—tend in their cured but "off" state to be an off-white or cream colour, while the ceramic-like insulator materials that surround the phosphor, such as those referred to hereinbefore, tend in their cured state to be white but to appear (at least, when viewed through an ITO-coated substrate) to be beige. The colour of such an insulator can be modified to be more like that of the phosphor by incorporating into the insulator suitable amounts of an appropriate solvent-based dye selected from Dylon's "Multipurpose" range—with the same specific phosphor and insulator mentioned above, the colour of the phosphor can be modified to be more like that of the insulator by incorporating into the phosphor suitable amounts of Dylon's "reindeer beige".

Secondly, there can be done what is effectively the opposite—the colour/reflectivity of the phosphor material can be changed to match that of the insulator. Thus, the phosphor material to be used can be blended with suitable colouring materials—inks—to give a colour match to the insulator material, so that when the insulator material is then deposited everywhere the phosphor is not—that is, around the phosphor—there is again presented the impression of a continuous layer when the combination is viewed through the transparent electrode.

With the same specific phosphor and insulator mentioned above, the colour of the phosphor can be modified to be more like that of the insulator by incorporating into the phosphor suitable amounts of an appropriate ink—in this case a white such as Sericol's Colorstar CS CS021.

A third possible way of achieving the desired colour/reflectivity matching of phosphor and insulator is to form between the substrate and the insulator layer an additional layer of suitably-coloured material so as effectively to mask the insulator layer from view, so again there is presented the impression of a continuous layer when the combination is viewed through the transparent electrode.

With the same specific phosphor mentioned above, the required insulator-masking layer can be formed using an ink such as Sericol's Colorstar CS CS021 (which has a matching white colour).

A fourth, and rather different, way of attaining the desired reduction in colour/reflectivity mismatch between the "off" phosphor and the insulator is to provide the display with a front filter/absorber layer of suitably-coloured transparent material so as appropriately to modify the manner in which external light entering the display from the ambient surroundings is transmitted thereinto and then reflected back. This filter layer, the use of which apparently modifies the colour/reflectivity of one or other of the electroluminescent material and the surrounding insulator material so as to match that of the other, either can be a part of the substrate itself or, and preferably, it can be an additional layer formed on the substrate (and conveniently on the outside, front, surface).

The filter layer appropriately modifies how external light entering the display is then reflected back from the several interfaces—typically ambient air/filter, filter/substrate, substrate/phosphor and substrate/insulator. In this particular case what is required is that the light reflected off the very front of the display—the front of the filter—should be very much greater that the light reflected off any of the "internal" interfaces, and that the light reflected from the substrate/phosphor interface should match in colour and hue the light reflected from the substrate/insulator interface. And when the display—the phosphor—is "on" (activated), the output from the phosphor should be significantly greater than any reflected light (and especially that off the filter at the very front).

Although the filter can cover the entire surface of the display, it can alternatively, and with advantage, be positioned to be (or not to be) only at places in register with with various individual images to be displayed.

It will be seen that, using such a filter, emitted light from the phosphor makes one pass through the filter while reflected light from the ambient surroundings must make two passes through the filter, and so the resultant visibility of any pattern of phosphor is, in the "off" state, reduced by the ratio of the absorbency of the filter. Of course, the overall brightness of the display is also reduced, but the ratio between the "on" state emissions and any of the various "off" state reflection levels is enhanced.

This effect can be further exploited if the reflectance spectrum of the filter is shifted in wavelength compared to the transmittance spectrum of the filter, so that the colour/hue of the emitted light from the phosphor is not the same as that of the reflected light from the very front—the filter—surface of the display. While this does not provide an improvement in light intensity terms nevertheless it improves visibility through chrominance contrast.

A suitable material colour for such a filter, providing the desired effect, is that deep blue provided by Ultramark under the designation 575/T134402.

These and other features of the present invention will become apparent upon review of the following detailed description of the invention when taken in conjunction with the drawings an appended claims.

BRIEF DESCRIPTION OF THE DRAWINGS

Various embodiments of the invention are now described, though by way of illustration only, with reference to the accompanying diagrammatic Drawings in which.

DETAILED DESCRIPTION OF THE INVENTION

Figure 1:
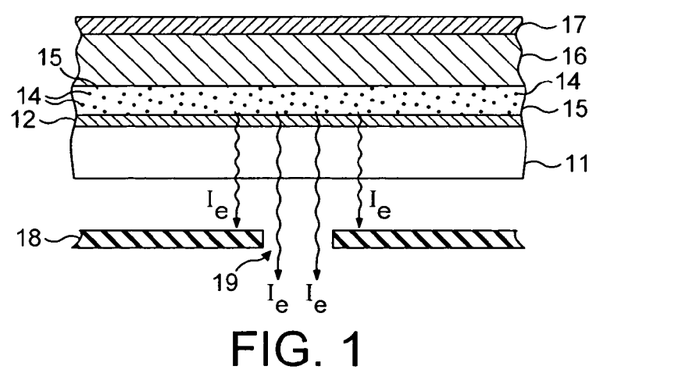
FIG. 1 shows in section a portion of a simplified Prior Art electroluminescent display

FIG. 1 shows in section a portion of a simplified Prior Art electroluminescent display. The display is built up on a transparent protective substrate 11 carrying the thin front electrode 12 on which is formed the thicker electroluminescent material (phosphor) layer 13. This phosphor is a granular, particulate, material (as 14) held within a binding matrix 15; the layer itself, however, is here shown as a continuous layer, extending over the entire area of the display.

Behind the phosphor layer 13—on top, as viewed—is a thick layer of an insulating ceramic layer 16, and on that has been formed the back electrode 17. This back electrode is a continuous one, extending, like the phosphor layer 13, over the entire area of the display.

In use an opaque mask 18 is positioned in front of the display—below it, as viewed. By the shaped apertures (as 19) this mask defines the "images" that the display is to show, the light $I_e$ emitted by the phosphor being allowed through each aperture 19 but being blocked everywhere else.

Figure 2:
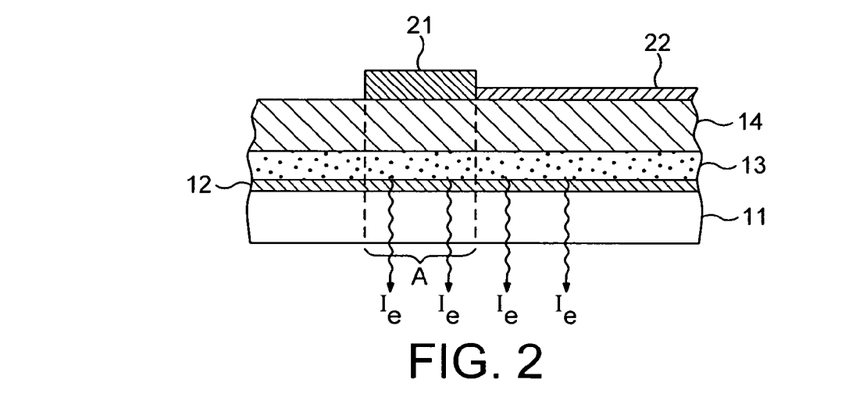
FIG. 2 shows in section a portion of an improved, patterned back electrode, version of the FIG. 1 simplified Prior Art display.
Figure 3:
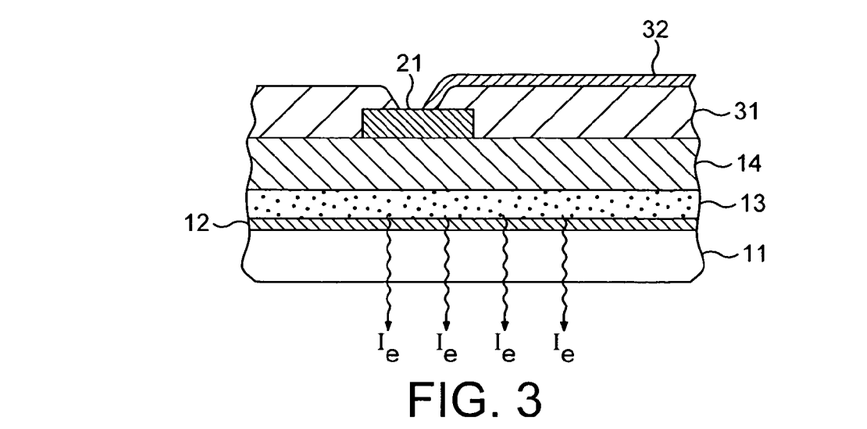
FIG. 3 shows in section a portion of a further improved, spaced track, version of the FIG. 2 simplified Prior Art display.

FIG. 2 shows in section a similar display portion, with substrate 11, transparent front electrode 12, continuous phosphor layer 13, and ceramic insulator layer 14, but has an image-defining back electrode made up of a number of shaped areas (as 21: only one is here shown) each addressable via thin and narrow lead tracks (as 22). Using a shaped, patterned back electrode 21 means notionally that only those areas (as A) of phosphor directly between the individual shapes 21 and the front electrode 11 are activated, providing illumination $I_e$. In practice, however, the individual lead tracks 22 also act as back electrodes, so that some small amount of illumination $i_e$ is also output from the phosphor layer under them, making the display seem confusing. This problem can be at least partly dealt with in the manner shown in FIG. 3, which shows a "spaced-track" version of the FIG. 2 display. As can be seen from FIG. 3, the shaped areas 21 of the back electrode have been surrounded by a thick layer 31 of insulating material, and then the lead tracks 32 to the electrode areas 21 have been formed on top of that. It will be evident that the tracks 32 are spaced considerably further from the phosphor layer 13 in the FIG. 3 embodiment than are the similar tracks 22 in the FIG. 2 embodiment, so that the effect the tracks 32 have is concomitantly smaller, and thus the amount of light $i_e$ that they cause to be emitted is also concomitantly smaller, possibly even to the extent of being negligible.

Figure 4:
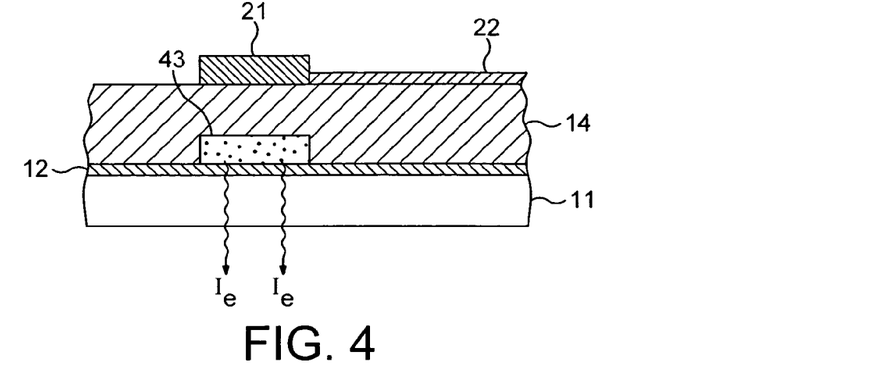
FIG. 4 shows in section a portion of a simplified display similar to that of FIG. 2 but further improved—having a patterned phosphor layer—in accordance with the invention.

According to the invention, an improved arrangement for avoiding lead track effects is shown in FIG. 4. This shows in section a portion of a simplified display similar to that of FIG. 2 but further improved by being made with a patterned phosphor layer made up of separate individual shapes 43 of phosphor material 43. As will be readily apparent, upon activation the emitted light can only come from the shaped phosphor portions, so there can—in principle—be none emitted because of the field generated by the lead tracks 22. However, in practice it may be that the phosphor and back electrode layers 43 and 21 are not exactly in register with each other, so that some short track portion might overlay a part of the relevant phosphor shape 43, and therefore to minimize any resulting effect of the tracks they are best constructed in the "raised" manner shown in FIG. 3—and this is shown in FIG. 5.

Figure 5:
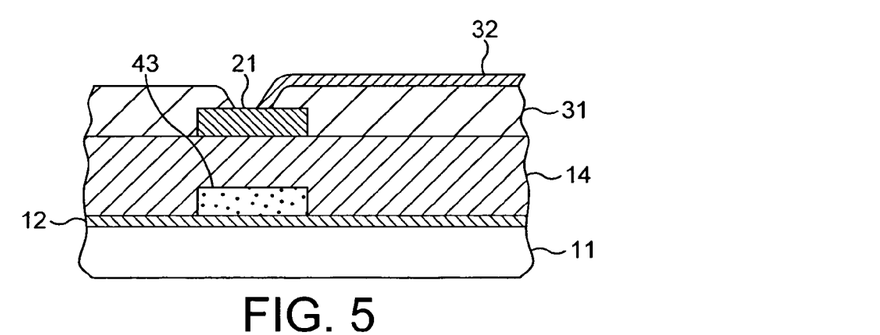
FIG. 5 shows in section a portion of an improved simplified display similar to that of FIG. 4 but further improved in the spaced-track manner shown in FIG. 3.
Figure 5A:
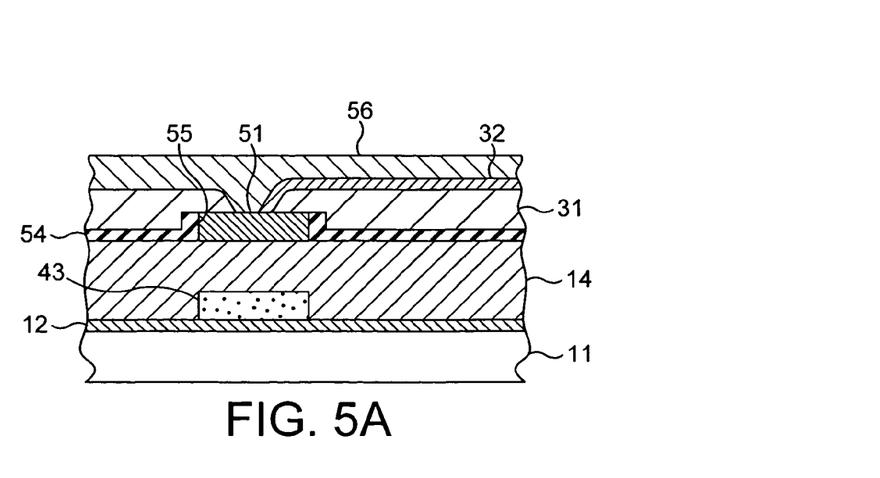
FIG. 5A shows in section a portion of an improved simplified display similar to that of FIG. 5 but further improved to facilitate its construction.

FIG. 5A shows in section a portion of an improved simplified display similar to that of FIG. 5 but further improved to facilitate its construction. More specifically, after the insulator layer 14 is formed the is printed into place an additional insulator layer 54, this being a "negative" image of the back electrode layout so that it has apertures 55 that effectively define the back electrode shaped areas. Then, when these areas are completed the electrode material may be laid down in areas that are each slightly larger than the specific shapes desired, so that each electrode 51 overlaps by a small amount the apertures 55 in the insulator layer 54.

FIG. 5A also shows the formation of a final, exterior, ceramic insulator layer 56, which provides protection for the previous layers.

Figure 6:
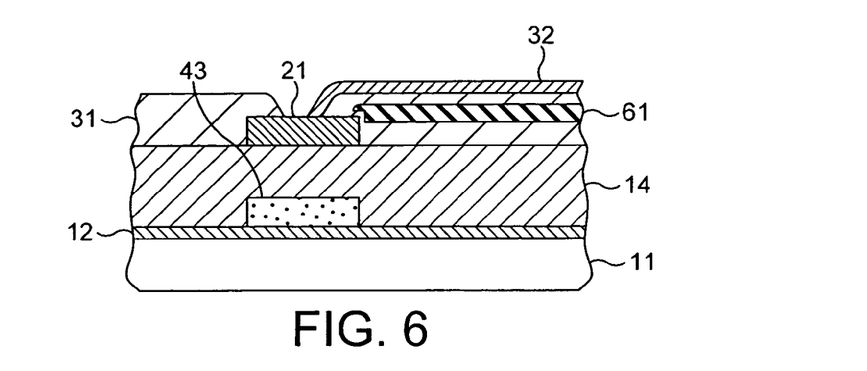
FIG. 6 shows in section a portion of an improved simplified display similar to that of FIG. 5 but further improved by the inclusion of a track-pattern shield.

Even the FIG. 5 version may still show some signs of the unwanted track effect, and therefore in the yet further improved version of FIG. 6 there is shown in section a portion of a display similar to that of FIG. 5 but including between the tracks 32 and the ceramic insulator layer 14 covering the phosphor layer shapes 43, and embedded in the track-raising insulator layer 31, a conductive track-pattern shield 61. In use this shield is made an intermediate electrode, connected to the front electrode 11 (by means not shown here) so as to be at the same operating potential thereas. By so doing the shield prevents any deleterious—light-generating—effect of the tracks 32.

Figure 7:
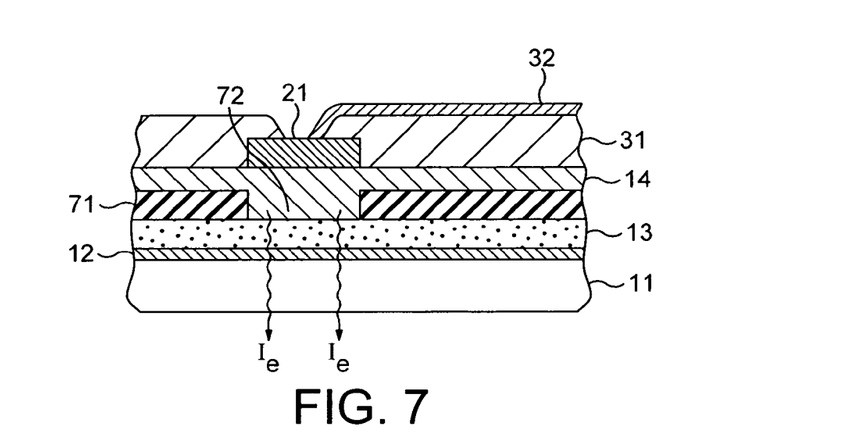
FIG. 7 shows in section a portion of an improved simplified display similar to that of FIG. 3 but further improved by the inclusion of a negative-electrode-pattern shield.

In FIG. 4 there is shown the concept of forming the phosphor layer in appropriately-shaped areas so as to provide the required image. FIG. 7 relates to the heretofore described alternative method of achieving this end by the inclusion of a negative-electrode-pattern shield. The display shown is like that of FIG. 3, but includes, between the ceramic insulator layer 14 and the phosphor layer 13, an apertured conductive layer 71 the aperture 72 of which (here filled with ceramic insulator material 14) defines, like the shaped electrode area 21, the image to be generated. In use the apertured conductive layer 71 forms an intermediate electrode, electrically connected to the front electrode so as to be at the same potential thereas, and thus—as will be apparent—it completely blocks the effect on the phosphor 13—here shown as a continuous layer—of the back electrode 21 and its lead track 32, so that only in the area of phosphor defined by the back electrode/intermediate electrode aperture is the phosphor activated and light emitted.

Figure 9:
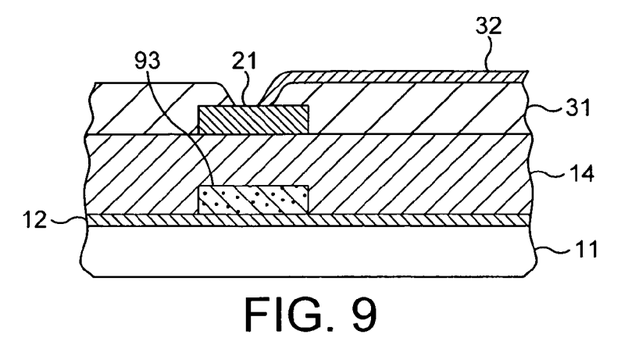
FIG. 9 shows in section a portion of an improved simplified display similar to that of FIG. 5 but alternatively yet further improved by "colouring" the phosphor layer.
Figure 10:
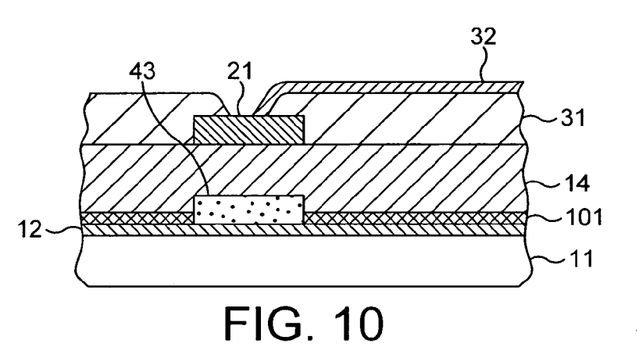
FIG. 10 shows in section a portion of an improved simplified display similar to that of FIG. 5 but alternatively yet further improved by providing an additional internal layer colour-matching the phosphor layer.

In its third aspect the present invention provides an electroluminescent display in which the colour/reflectivity of one or other of the electroluminescent material and the surrounding insulator material is modified so as to match that of the other. This is shown in FIGS. 8, 9 and 10.

Figure 8:
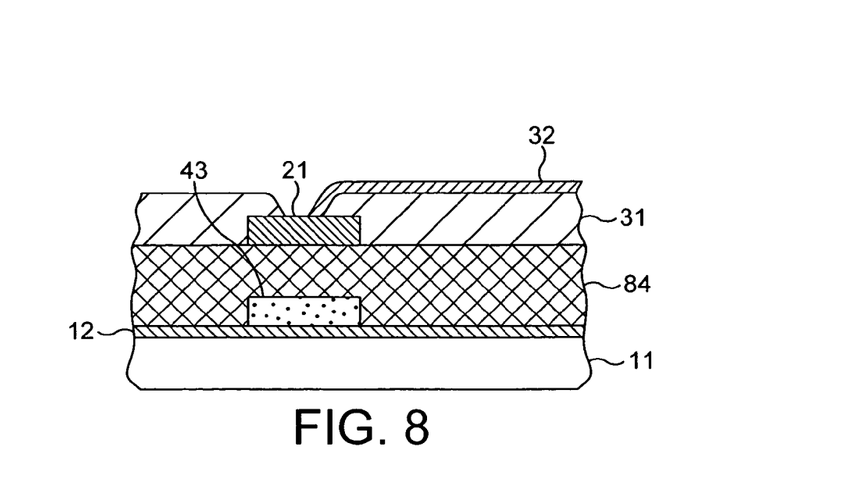
FIG. 8 shows in section a portion of an improved simplified display similar to that of FIG. 5 but yet further improved by "colouring" the ceramic insulator layer.

In FIG. 8 is shown one such modified version, wherein the ceramic insulator layer 84 has been coloured to match the colour of the phosphor 43. FIG. 9 shows the case where the phosphor 93 has been coloured to match the ceramic insulator layer 14, and FIG. 10 shows the case where an ink layer 101 has been provided around the shaped area phosphor 43 on the transparent electrode 12, with the ceramic insulator layer 14 over both. The ink layer 101 is coloured to match the phosphor 43.

Figure 11:
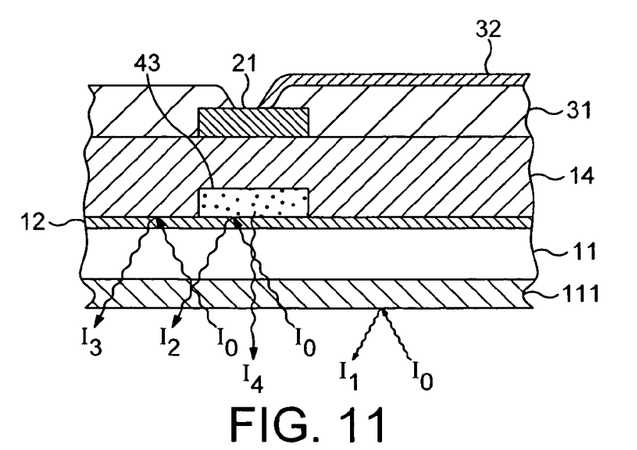
FIG. 11 shows in section a portion of an improved simplified display similar to that of FIG. 5 but alternatively yet further improved by using an external "colouring" layer.
Figure 12:
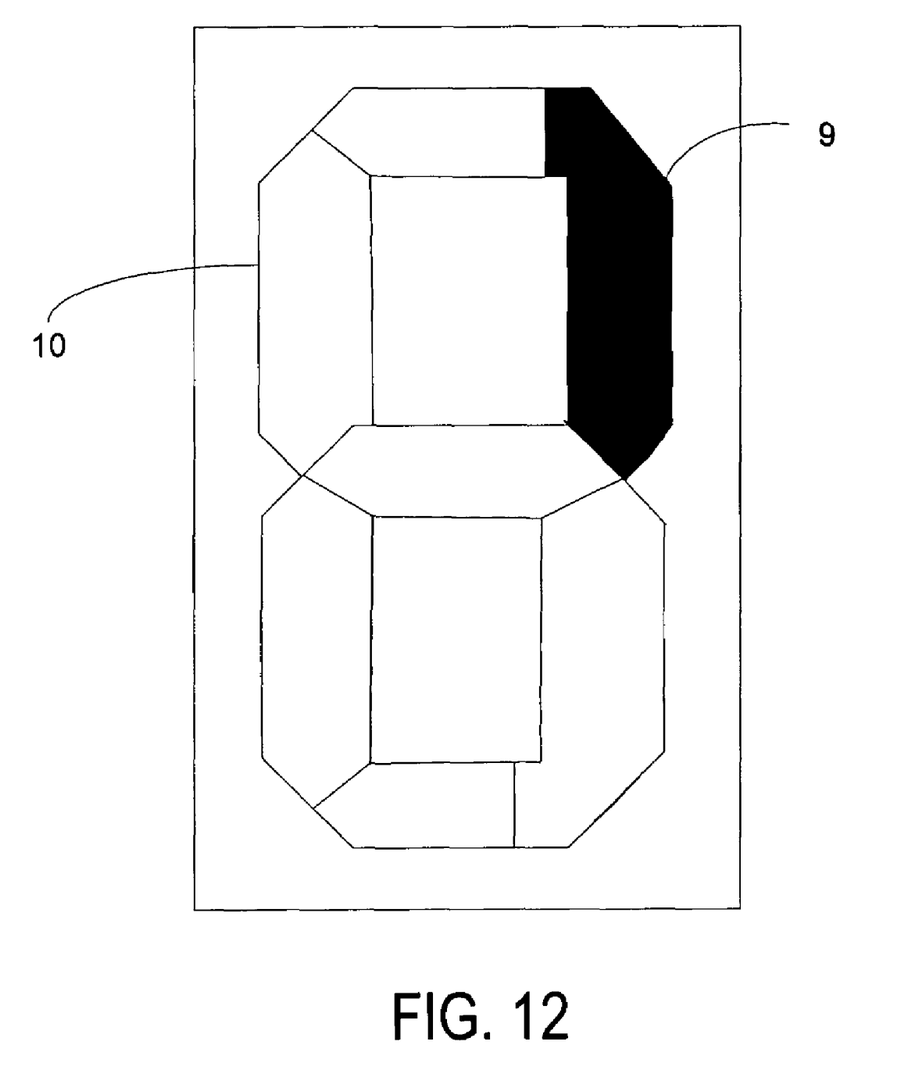
FIG. 12 shows a display of the form of the well-known segment-display frequently found on such devices as pocket calculators. Each separate segment is individually illuminatable; the figures show segment 10 as being illuminated while segment 9 is not. The display is therefore presently showing the figure "6". Each segment has an individual appropriately-shaped electrode such that when a voltage is applied between the electrode relating to a segment and a further electrode, then the relevant segment will illuminate.

Finally, in FIG. 11 there is shown a slightly different way of reducing the apparent contrast between the shaped area phosphor 43. Over the entire front surface of the substrate 11 there has been formed a coloured filter layer 111. The filter layer 111 modifies how external light $I_0$ entering the display is then reflected back from the several interfaces—filter/substrate 111/11, substrate/phosphor 11/43 and substrate/insulator 11/14 (the very thin transparent electrode 12 is here ignored)—such that the light $I_1$ reflected off the very front of the display—the front of the filter 111—is very much greater that the light $I_2$, $I_3$ reflected off any of the "internal" interfaces, and that the light $I_2$ reflected from the substrate/phosphor interface should match in colour and hue the light $I_3$ reflected from the substrate/insulator interface. And when the display—the phosphor 43—is "on" (activated), the light $I_4$ output from the phosphor is significantly greater than any reflected light (and especially that, $I_1$, off the filter 111 at the very front).

As observed hereinbefore, it will be seen that emitted light 14 from the phosphor 43 makes one pass through the filter 111 while reflected light $I_2$, $I_3$ originating from the ambient surroundings must make two passes through the filter, and so the resultant visibility of any pattern of phosphor 42 is, in the "off" state, reduced by the ratio of the absorbency of the filter. The result is that there is presented the impression of a continuous layer when the combination is viewed.

And if the reflectance spectrum of the filter 111 is shifted in wavelength compared to the filter's transmittance spectrum, so that the colour/hue of the viewed emitted light $I_4$ from the phosphor 43 is not the same as that of the reflected light $I_1$ from the very front—the filter—surface of the display, then there is achieved an improvement in visibility through chrominance contrast.

It should be apparent that the foregoing relates only to the preferred embodiments of the present invention and that numerous changes and modification may be made herein without departing from the spirit and scope of the invention as defined by the following claims and the equivalents thereof.

We claim:

1. An electroluminescent display of the type wherein a layer of electroluminescent material is sandwiched between but spaced from two electrode layers, which display has a plurality of separately-activatable individual areas each of electroluminescent (phosphor) material, the display comprising:
    a back electrode layer composed of a plurality of separate areas each matching in shape and size the image which the relevant portion of the display is to show; and
    a shield layer of insulating material shaped and sized as a negative of the back electrode positioned intermediate between and aligned with the back electrode layer and the electroluminescent material.

2. A display as claimed in claim 1 which uses, as the electroluminescent material, a particulate phosphor.

3. A display as claimed in claim 2, wherein the particulate phosphor is zinc sulphide in the form of encapsulated particles.

4. A display as claimed in claim 1, wherein the separately-activatable individual areas are grouped into sets of related character-defining segments each group of which can, by the activation of the appropriate segments, define any character there to be displayed.

5. A display as claimed in claim 4, wherein each group is the standard seven-segment group commonly employed in modern electrical and electronic displays.

6. An electroluminescent display of the type wherein a layer of electroluminescent material is sandwiched between but spaced from two electrode layers, which display has a plurality of separately-activatable individual areas each of electroluminescent (phosphor) material, the display comprising:
    a back electrode layer composed of a plurality of separate areas each matching in shape and size the image which the relevant portion of the display is to show;
    a front electrode layer; and
    a shield layer of electrically-conductive material shaped and sized as a negative of the back electrode layer positioned as an intermediate electrode between and aligned with the back electrode layer and the electroluminescent material; and
    means are provided enabling the shield layer intermediate electrode to be given the same electrical potential as the front electrode.

7. A display as claimed in claim 6, wherein the means enabling the shield layer intermediate electrode to be maintained at the same electrical potential as the front electrode is a simple electrical connection between the two.

8. A display as claimed in claim 6, wherein the electroluminescent material (phosphor) layer is shaped into a plurality of image-defining areas.

9. A display as claimed in claim 1, wherein the electroluminescent (phosphor) material is shaped into a plurality of image-defining areas.

10. A display as claimed in claim 6, wherein the electroluminescent (phosphor) material is shaped into a plurality of image-defining areas.

* * * * *